United States Patent

Milam

[11] Patent Number: 5,892,399
[45] Date of Patent: Apr. 6, 1999

[54] CURRENT BOOST CIRCUIT FOR REDUCING CROSSOVER DISTORTION IN AN OPERATIONAL AMPLIFIER

[75] Inventor: Stephen W. Milam, Carrollton, Tex.

[73] Assignee: Texas Instruments Incorporated, Dallas, Tex.

[21] Appl. No.: 901,147

[22] Filed: Jul. 28, 1997

Related U.S. Application Data

[60] Provisional application No. 60/022,082 Jul. 29, 1996.

[51] Int. Cl.$^6$ ........................................................ H03F 3/30
[52] U.S. Cl. ............................................. 330/264; 330/268
[58] Field of Search ..................................... 330/255, 264, 330/268, 269, 274, 277; 327/112

[56] References Cited

U.S. PATENT DOCUMENTS 5,638,025  6/1997  Johnson ................................ 330/269 X Primary Examiner—James B. Mullins
Attorney, Agent, or Firm—Alan K. Stewart; Wade James Brady, III; Richard L. Donaldson

[57] ABSTRACT

A current boost circuit includes: a first transistor $M_{10}$ having a gate coupled to an input node; a second transistor $M_{11}$; a first capacitance $C_{C3}$ coupled between a gate of the second transistor $M_{11}$ and a drain of the first transistor $M_{10}$; a third transistor $M_{17}$ having a gate coupled to a drain of the second transistor $M_{11}$; and a second capacitance $C_{C1}$ coupled between the drain of the second transistor $M_{11}$ and a drain of the third transistor $M_{17}$.

6 Claims, 1 Drawing Sheet

CURRENT BOOST CIRCUIT FOR REDUCING CROSSOVER DISTORTION IN AN OPERATIONAL AMPLIFIER

This application claims priority under 35 U.S.C. § 119 (e) (1) of provisional application number 60/022,082, filed Jul. 29, 1996.

FIELD OF THE INVENTION

This invention generally relates to electronic circuits and in particular it relates to current boost circuits for operational amplifiers.

BACKGROUND OF THE INVENTION

FIG. 1 shows a prior art operational amplifier output stage. The prior art circuit of FIG. 1 includes transistors $M_{10}$–$M_{17}$, resistors $R_{C1}$ and $R_{C2}$, capacitors $C_{C1}$ and $C_{C2}$, negative rail $V_{SS}$, positive rail $V_{DD}$, input voltage $V_{IN}$, output voltage $V_{OUT}$, and bias voltages $V_{B1}$ and $V_{B2}$. When the input voltage $V_{IN}$ is close to the negative rail $V_{SS}$, transistor $M_{16}$ has the potential to source much more current than $M_{17}$ sinks so the output voltage $V_{OUT}$ is close to the positive rail $V_{DD}$. The gate of transistor $M_{17}$ is then at a lower voltage than the drain. If there is a large positive voltage step at the input $V_{IN}$ of this stage, transistor $M_{16}$ turns off quickly. However, to drive the output voltage close to the negative rail $V_{SS}$, $M_{17}$ must provide current to the load. Thus the voltage from gate to drain of $M_{17}$ must change from a large negative value to a positive value. This change requires a large current to pass through $C_{C1}$. The only source for this current is transistor $M_{11}$. Due to a constant voltage at its gate, transistor $M_{11}$ provides a constant bias current for $M_{13}$ and $M_{15}$, but this current is not sufficient to charge $C_{C1}$ quickly enough for large signal transitions. Therefore this output stage exhibits crossover distortion under heavy loading conditions.

SUMMARY OF THE INVENTION

Generally, and in one form of the invention, the current boost circuit includes: a first transistor having a gate coupled to an input node; a second transistor; a first capacitance coupled between a gate of the second transistor and a drain of the first transistor; a third transistor having a gate coupled to a drain of the second transistor; and a second capacitance coupled between the drain of the second transistor and a drain of the third transistor.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
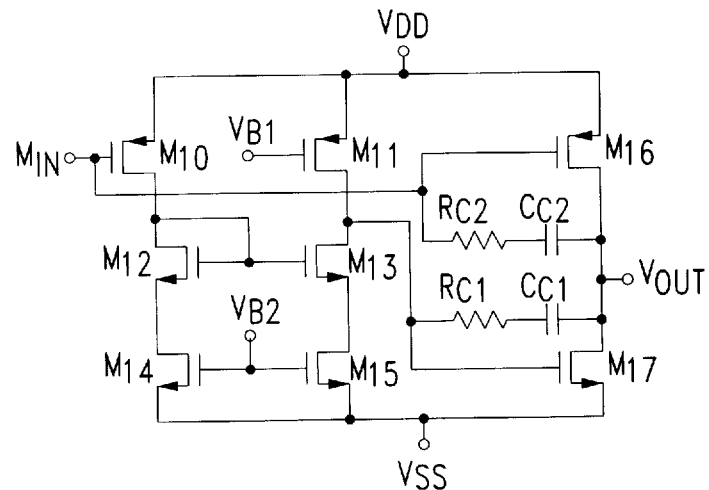
FIG. 1 is a schematic diagram of a prior art operational amplifier output stage.
Figure 2:
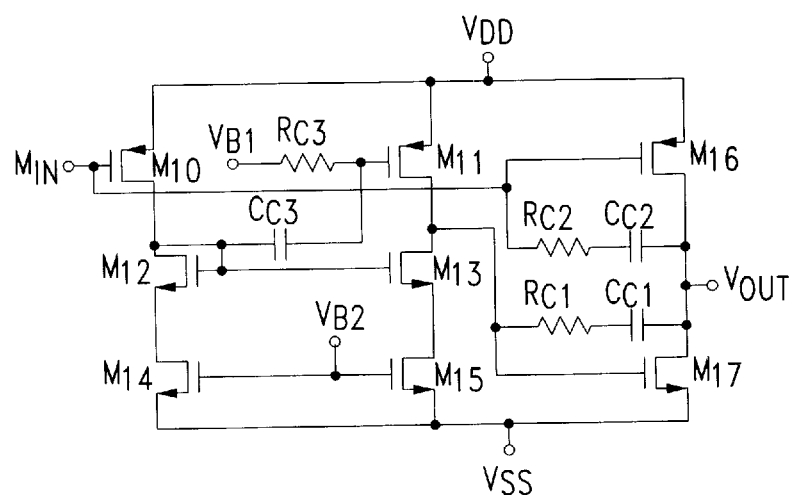
FIG. 2 is a schematic diagram of a preferred embodiment operational amplifier output stage.

Referring to FIG. 2, a circuit diagram of a preferred embodiment operational amplifier is shown. The circuit of FIG. 2 includes transistors $M_{10}$–$M_{17}$, resistors $R_{C1}$, $R_{C2}$, and $R_{C3}$, capacitors $C_{C1}$, $C_{C2}$, and $C_{C3}$, negative rail Vss, positive rail $V_{DD}$, input voltage $V_{IN}$, output voltage $V_{OUT}$, and bias voltages $V_{B1}$ and $V_{B2}$. The circuit of FIG. 2 includes the circuit of FIG. 1 with the addition of resistance $R_{C3}$ and capacitance $C_{C3}$. On a positive transition at the input $V_{IN}$, the drain voltage of transistor $M_{10}$ decreases, causing capacitance $C_{C3}$ to pull the gate of transistor $M_{11}$ down. As the voltage from the source to the gate of transistor $M_{11}$ increases, transistor $M_{11}$ provides more current, and capacitance $C_{C1}$ charges faster. After a certain time constant determined by the product of resistance $R_{C3}$ and capacitance $C_{C3}$, the current flowing through transistor $M_{11}$ returns to its quiescent value.

Alternative versions of the preferred embodiment include many variations in resistance $R_{C3}$ such as leaving it out of the circuit completely or forming an equivalent resistance with other components (for example, a MOSFET biased in the linear region). There are also ways to use parasitic circuit components to form a capacitance that replaces capacitance $C_{C3}$. These alternative embodiments provide the same improvement in performance described above. The same principle applies to other amplifier stages as well. The deficiency in the prior art circuit shown in FIG. 1 is the lack of current available for charging capacitance $C_{C1}$ during a large output voltage swing. This lack of current is a problem in other amplifiers as well, and this preferred embodiment applies to amplifiers that charge a capacitor from a fixed current source.

The preferred embodiment produces no increase in the speed (bandwidth) of the circuit, since the product of the current available from a previous stage and the value of capacitor $C_{C2}$ determines the bandwidth. Neither of these determining quantities changes with the addition of the preferred embodiment.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A current boost circuit for an operational amplifier comprising:

a first transistor having a gate coupled to an input node;

a second transistor having a drain coupled to a drain of the first transistor and a gate coupled to the drain of the first transistor;

a first capacitance having a first end coupled to the drain of the first transistor;

a third transistor having a gate coupled to a second end of the capacitance;

a fourth transistor having a drain coupled to a drain of the third transistor and a gate coupled to the gate of the second transistor;

a second capacitance having a first end coupled to the drain of the fourth transistor;

a fifth transistor having a gate coupled to the drain of the fourth transistor and a drain coupled to a second end of the second capacitance;

a sixth transistor having a drain coupled to the drain of the fifth transistor and a gate coupled to the input node;

a first resistance having a first end coupled to the gate of the third transistor and a second end coupled to a first bias node;

a seventh transistor having a drain coupled to a source of the second transistor;

an eighth transistor having a drain coupled to a source of the fourth transistor and a gate coupled to a gate of the seventh transistor;

a third capacitance coupled between the drain of the sixth transistor and the input node;

a second resistance coupled between the third capacitance and the input node; and a third resistance coupled between the second capacitance and the drain of the fourth transistor.

2. The circuit of claim 1 wherein the first, second, third, fourth, fifth, sixth, seventh, and eighth transistors are MOS transistors.

3. The circuit of claim 1 wherein the first, third, and sixth transistors are PMOS transistors.

4. The circuit of claim 1 wherein the second, fourth, fifth, seventh, and eighth transistors are NMOS transistors.

5. The circuit of claim 1 further comprising a bias node coupled to the gate of the seventh transistor.

6. The circuit of claim 1 wherein the first capacitance is a capacitor.

* * * * *